United States Patent
Ohtsuka (10) Patent No.: US 8,133,779 B2
(45) Date of Patent: Mar. 13, 2012

(54) METHOD OF FABRICATING A SEMICONDUCTOR DEVICE

(75) Inventor: Keisuke Ohtsuka, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 44 days.

(21) Appl. No.: 12/577,364

(22) Filed: Oct. 12, 2009

(65) Prior Publication Data

US 2010/0093149 A1    Apr. 15, 2010

(30) Foreign Application Priority Data

Oct. 14, 2008  (JP) .................................. 2008-265238

(51) Int. Cl.
*H01L 21/8234* (2006.01)
*H01L 21/8244* (2006.01)
*H01L 21/8242* (2006.01)

(52) U.S. Cl. ........ 438/238; 438/239; 438/244; 438/253; 438/386; 257/E21.252; 257/E21.256; 257/E21.548

(58) Field of Classification Search ........... 257/E21.252, 257/E21.256, E21.548
See application file for complete search history.

(56) References Cited

U.S. PATENT DOCUMENTS

| 6,265,262 B1 * | 7/2001 | Okuno et al. ................ 438/253 |
| 7,791,163 B2 * | 9/2010 | Kuroi et al. .................. 257/520 |
| 2008/0081431 A1 * | 4/2008 | Roh et al. ..................... 438/397 |
| 2008/0173920 A1 * | 7/2008 | Juengling ..................... 257/306 |
| 2010/0109062 A1 * | 5/2010 | Kadoya ........................ 257/296 |

FOREIGN PATENT DOCUMENTS

| JP | 6-45326 | 2/1994 |
| JP | 6-104222 | 4/1994 |
| JP | 8-279489 | 10/1996 |
| JP | 2006-140405 | 6/2006 |
| JP | 2006-310752 | 11/2006 |
| JP | 2006-319058 | 11/2006 |
| JP | 2008-124391 | 5/2008 |

OTHER PUBLICATIONS

Lee et al., English Machine Translation of JP Publication No. 2006-310752, Nov. 9, 2006; (Machine Translated Apr. 28, 2011).*
Shinpei, English Machine Translation of JP Publication No. 2006-140405, Jun. 1, 2006; (Machine Translated Apr. 28, 2011).*
Tonotani, J. et al. (Sep. 16, 2003). "Dry Etching Characteristics of TiN film using Ar/CHF$_3$, Ar/Cl$_2$, and Ar/BCl$_3$ Gas Chemistries in an Inductively Coupled Plasma." *Journal of Vacuum Science& Technology B*:21(5):2163-2168: cover page and Table of contents.
Japanese Office Action mailed on Oct. 6, 2010, directed to counterpart Japanese Patent Application No. 2008-265238; 4 pages (partial English translation).

* cited by examiner

*Primary Examiner* — Mohsen Ahmadi
(74) *Attorney, Agent, or Firm* — Morrison & Foerster LLP (57) ABSTRACT

A conductive film is formed to extend from a bottom and a sidewall of a recess formed in an interlayer insulating film onto a top surface of the interlayer insulating film. Dry etching of the conductive film is performed such that a portion of the conductive film remains on the bottom and sidewall of the recess. The dry etching is also performed such that a deposition film is formed on a top portion of the recess.

19 Claims, 11 Drawing Sheets

Deposition Film

METHOD OF FABRICATING A SEMICONDUCTOR DEVICE

BACKGROUND OF THE INVENTION

1. Field of the Invention

The present invention relates to a method of fabricating a semiconductor device. More specifically, the present invention relates to such a fabrication method which includes forming a conductive film over an insulator having a recess and then selectively removing only a portion of the conductive film which lies on the insulator.

2. Description of the Related Art

As a semiconductor storage device, a DRAM of the type having a structure comprising a single transistor and a single capacitor has been widely used. With growing integration density of semiconductor devices including the DRAM, the DRAM has been decreasing in memory cell size. In order for the DRAM to operate stably, a capacitor of the DRAM needs to have a certain level of capacitance or higher. For this reason, a capacitor having a three-dimensional structure has been developed. Among such three-dimensional capacitor structures, there is a cylindrical capacitor structure.

The lower electrode of such a cylindrical capacitor is formed according to the following method.

(a) A memory cell transistor, a bit line contact, a bit line and a capacitor contact plug are formed on a semiconductor substrate. A capacitor oxide film for forming the capacitor is formed to a thickness of 1 to 3 µm over the resulting structure.

(b) A capacitor hole is formed through the capacitor oxide film by using the techniques of lithography and dry etching so as to expose an upper portion of the capacitor contact plug.

(c) A conductive film which will form the lower electrode serving as a storage electrode is formed so as to cover the interior of the capacitor hole and a surface of a capacitor interlayer insulating film.

(d) A portion of the conductive film which lies on the interlayer insulating film is removed, while the other portion of the conductive film which lies on a sidewall and bottom portion of the hole is allowed to remain.

Two methods including a method using CMP and a method using dry etching are applicable to the process step (d). As compared with CMP, the dry etching technique has been conventionally used and hence has the advantages of being capable of utilizing existing equipment and requiring a low fabrication cost and other advantages. For this reason, desires to use dry etching exist.

In a process using dry etching, a protective insulating film is formed in the capacitor hole before dry etching for removing the portion of the conductive film which lies on the interlayer insulating film in order to prevent the bottom of the hole from being etched. This is because connection to the contact plug formed under the hole cannot be made if the bottom of the hole is etched.

Japanese Patent Laid-Open No. 2006-140405 describes a technique related to a cylindrical capacitor using a metal electrode such as of TiN as its lower electrode for the purpose of improving the capacitor performance.

Paragraph [0098] of Japanese Patent Laid-Open No. 2006-140405 discloses a technique such that when a deep hole having an aspect ratio of not less than 7 is formed in an insulating film, removal of titanium nitride exposed on the interlayer insulating film can be achieved while allowing titanium nitride to remain in the bottom of the deep hole without the need to fill the deep hole with an insulating film.

Usually, chlorine ($Cl_2$) is used for etching of TiN. This is because the use of chlorine ($Cl_2$) ensures adequate etching rate and selective ratio. $BCl_3$, on the other hand, exhibits a low etching rate and hence is usually not suitable for volume production. For this reason, $BCl_3$ is hardly used alone as an etching gas for TN, and it has been a common practice to use $BCl_3$ either as an additive to be added to a main etching gas e.g., chlorine ($Cl_2$) for the purpose of removing oxides and the like produced during etching or in cleaning the surface of the underlying film after the removal of TiN.

FIGS. 6A to 6D are sectional views illustrating an etching process using chlorine ($Cl_2$) for etching titanium nitride deposited over a surface of an insulating film formed with a deep hole having an aspect ratio of not less than 7 without filling the deep hole with an insulating film. Interlayer insulating film 31 is formed over capacitor contact plug 21. A hole having a small opening diameter (of not more than 300 nm for example) is formed to extend through interlayer insulating film 31. Subsequently, titanium nitride film 41 is formed non-selectively. When etching is performed without protecting the opening defined by titanium nitride film 41 with a protective film, etching ions (i.e., chlorine ions) 51 fail to reach the bottom of the deep hole because of the microloading effect, thereby allowing a portion of titanium nitride film 41 which lies in the bottom of the hole to remain. However, since the reactivity of chorine ions is high, restriction on etching of a portion of titanium nitride film 41 which lies at the sidewall surface of the deep hole is insufficient. That is, the etching rate increases as the hole extends closer to its opening top. Therefore, a problem exists that the portion of the titanium nitride which lies at the sidewall surface of the deep hole adjacent to the opening top is undesirably removed by etching as illustrated in FIGS. 6A to 6D. This is because as the removal of the portion of the conductive film which lies on the interlayer insulating film by etching proceeds, the consumption of the etching gas at the surface of the interlayer insulating film decreases, whereas the etching rate of the portion of the conductive film which lies at the sidewall portion of the recess increases by supply of fresh etching gas. That is, there arises a problem that when chlorine ($Cl_2$) is used in the formation of the lower electrode of a DRAM capacitor, the lower electrode has a lowered capacitance that is lower than a designed value though the design ensures a sufficient capacitance.

SUMMARY

As a result of intensive study on the foregoing problems by the present inventor, it has been found that in removing a conductive film such as of titanium nitride deposited over a surface of an interlayer insulating film having a recess by etching, intentional use of an etching gas having a low etching rate allows a deposition film to be preferentially formed, whereby only a portion of the conductive film which lies over the top surface of the interlayer insulating film can be selectively removed by etching in such a manner that a portion of the conductive film which lies at a bottom and sidewall portion of the recess is allowed to remain without the need to fill the recess with a protective film.

That is, according to one embodiment of the present invention, there is provided a method of fabricating a semiconductor device, comprising:

forming an interlayer insulating film;

forming a recess in the interlayer insulating film;

forming a conductive film extending from a bottom and a sidewall of the recess onto a top surface of the interlayer insulating film; and selectively removing a portion of the conductive film formed on the top surface of the interlayer insulating film by dry etching such that a portion of the conductive film remains on the bottom and sidewall of the recess, wherein the dry etching is performed such that a deposition film is formed on a top portion of the recess.

The formation of the deposition film is observed in cases where the conductive film comprises Ti, Zr, Hf, or a compound thereof, particularly with use of a boron compound as an etching gas. When the opening diameter of the recess is not more than 300 nm, the formation of the deposition film at the internal portion of the recess which lies adjacent to the opening of the recess is remarkable and, hence, the opening diameter of the recess can be reduced substantially. This results in a considerable effect on the restriction of etching of the portion of the conductive film lying on the sidewall portion of the recess, particularly the restriction of etching at a sidewall surface of the recess which lies adjacent to the opening, which is the problem with the related art.

Figure 5A:
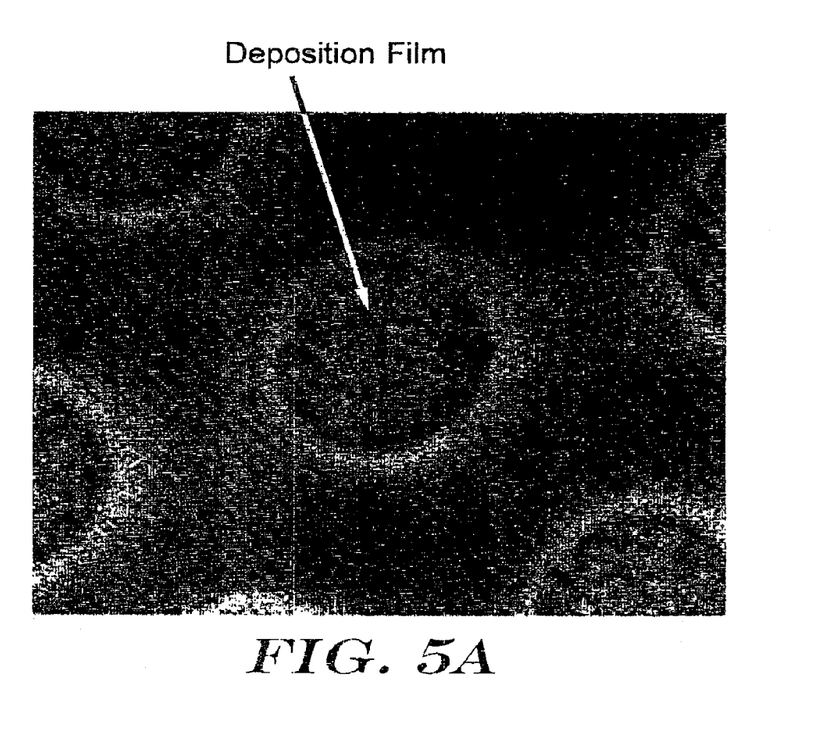
FIG. 5A is an SEM photograph showing a plane of a structure resulting after having been subjected to dry etching of a conductive film according to the present invention.
Figure 5B:
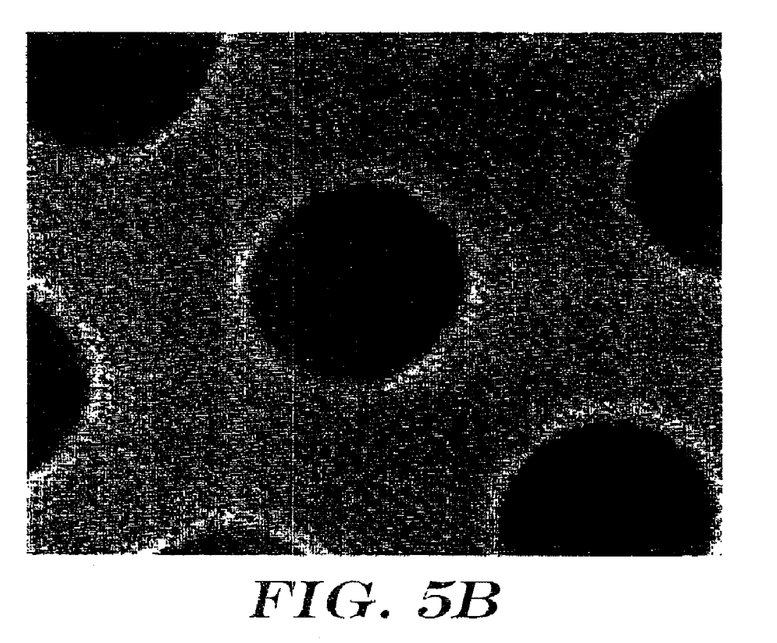
FIG. 5B is an SEM photograph showing a plane of a structure resulting after removal of the deposition film.
Figure 6A:
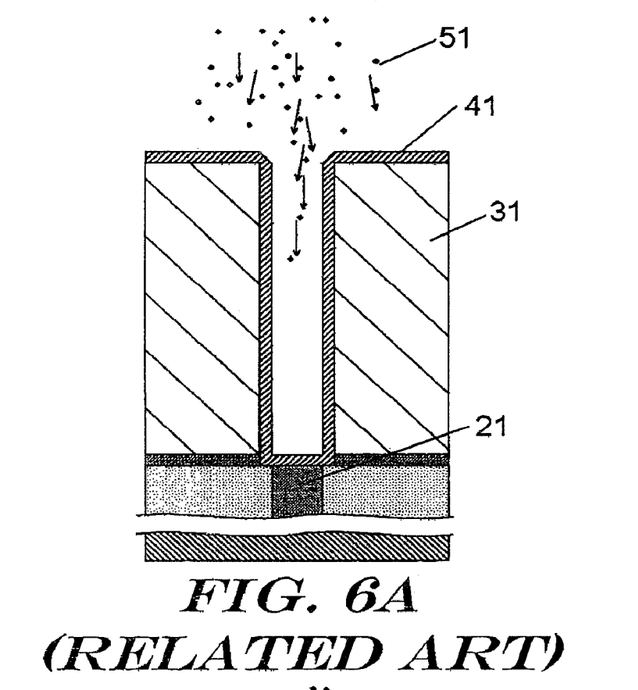
FIGS. 6A to 6D are sectional views illustrating a problem with the related art.
Figure 6B:
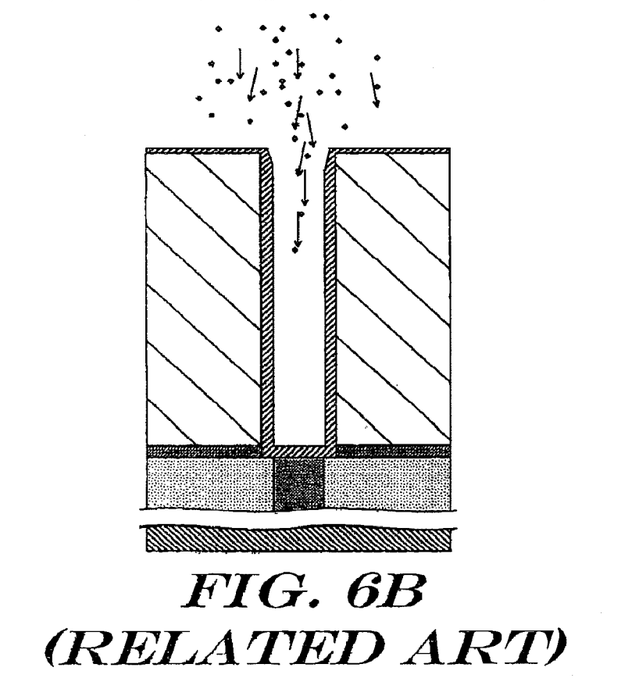
Figure 6C:
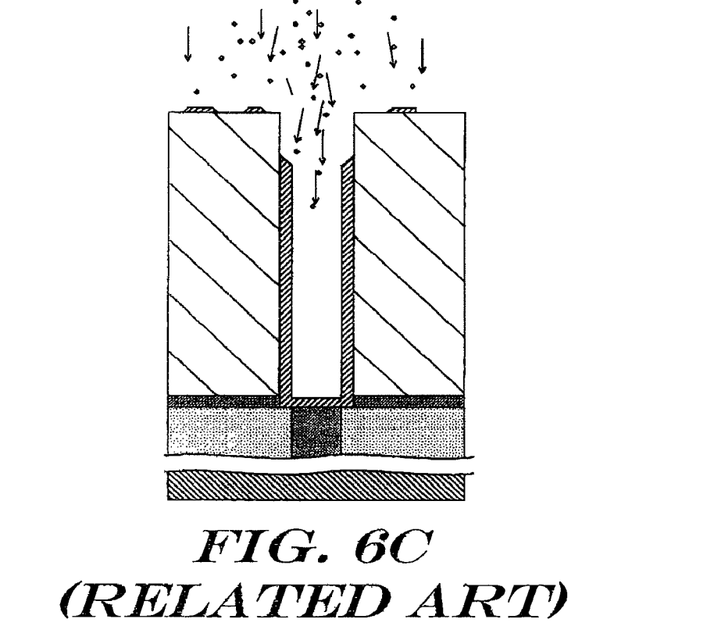
Figure 6D:
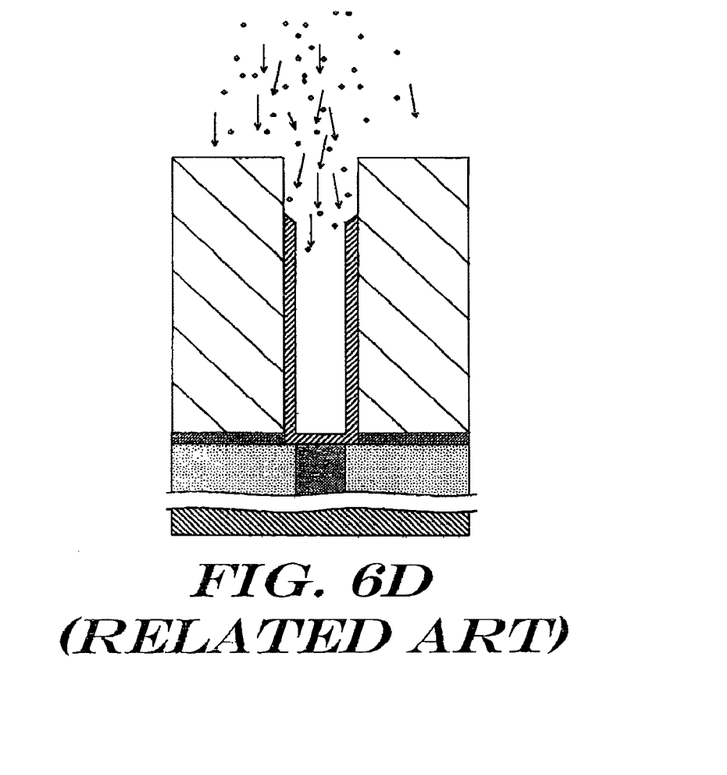

FIG. 5A is an SEM photograph showing a plane of a structure having been subjected to dry etching of a film stack of TiN and Ti deposited as a conductive film according to the present invention. It was observed that the conductive film formed over the interlayer insulating film was removed, while a deposition film was deposited in each hole. In this case, the opening of each hole is seen to have been substantially completely closed with the deposition film. As a result, the portion of the conductive film remaining on the sidewall and bottom portion of the hole was able to have a sufficient film thickness. Though each of the holes shown in the photograph had a hole top diameter of 200 nm and a depth of 2 µm, the present invention was confirmed to be effective when the hole diameter was not more than 300 nm. The present invention was also confirmed to be effective when the aspect ratio of each hole was not less than 5. FIG. 5B is an SEM photograph showing a plane of a structure resulting from the structure shown in FIG. 5A after removal of the deposition film. As can be seen, the deposition film formed centrally of each hole was removed.

The present invention can provide a technique of allowing the portion of the conductive film which lies on the bottom and sidewall of the recess to remain by protecting the interior of the hole with the deposition film deposited during the dry etching of the conductive film even when the conductive film is removed by the dry etching. The present invention can also provide a technique of allowing sufficient additional etching to be performed thereby improving the product yield.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purpose.

Hereinafter, exemplary embodiments of the present invention will be described with reference to the drawings.

Figure 1A:
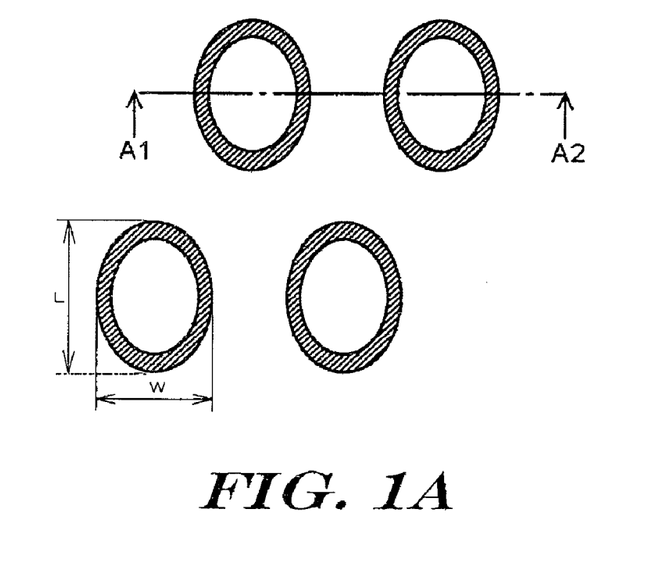
FIG. 1A is a plan view illustrating an exemplary form of a recess (i.e., hole) to which the present invention is to be applied.
Figure 1B:
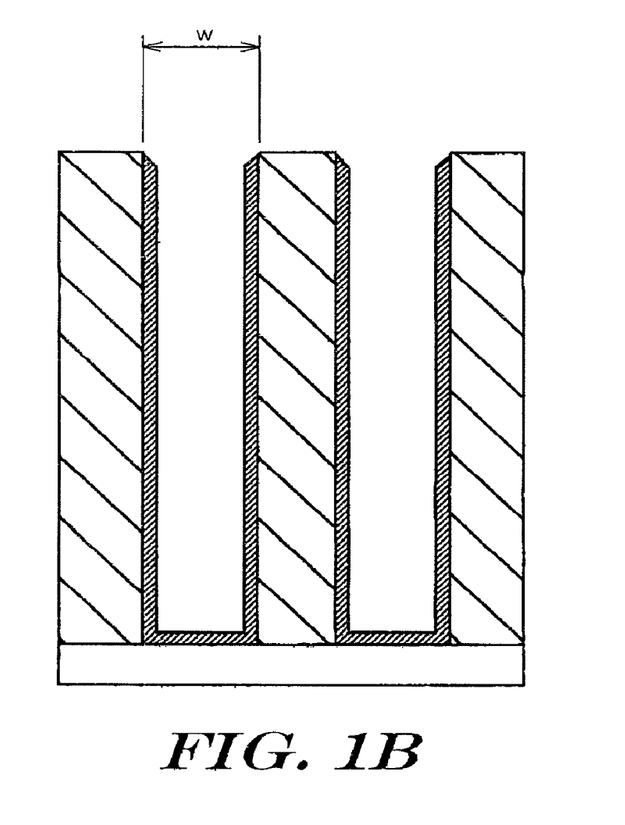
FIG. 1B is a sectional view taken on line A1-A2 of FIG. 1A.

FIGS. 1A and 1B illustrate recesses each in the form of a hole. A conductive film formed in each of the holes is a lower electrode of a capacitor for example. FIGS. 1A and 1B are a plan view and a sectional view, respectively. When, for example, an elliptic hole is formed, the hole has a major axis L and a minor axis W. The "opening width", as used in the present invention, corresponds to the minor axis W.

Figure 2A:
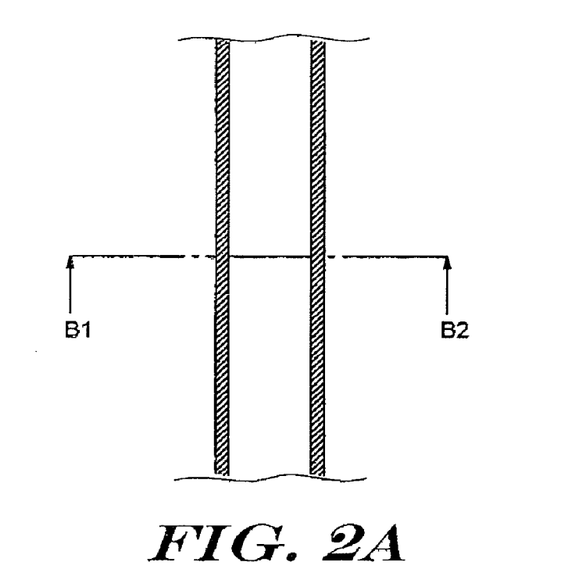
FIG. 2A is a plan view illustrating an exemplary form of a recess (i.e., trench) to which the present invention is to be applied.
Figure 2B:
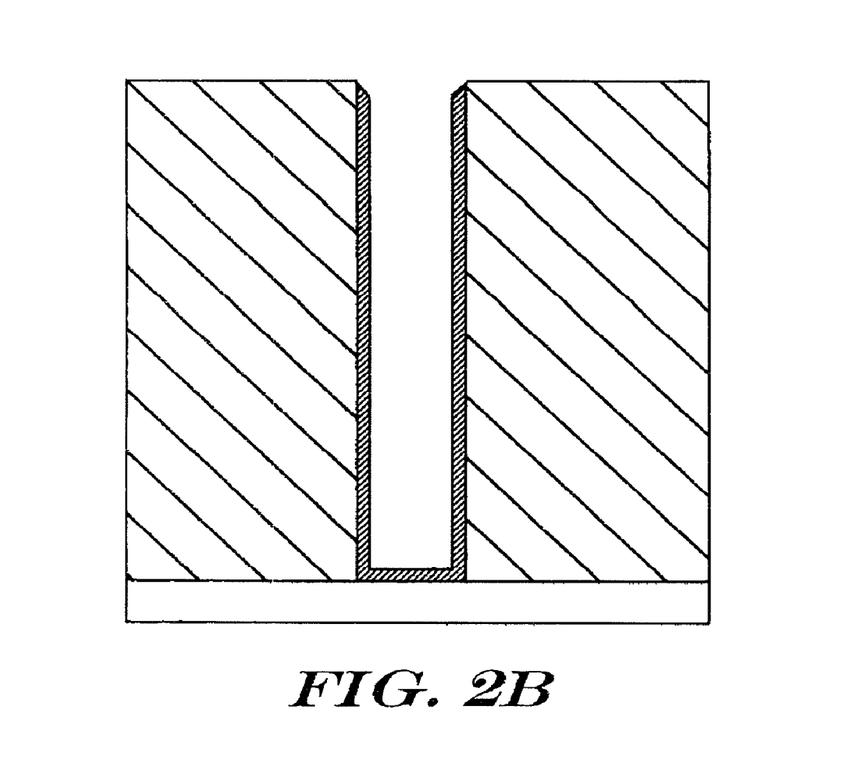
FIG. 2B is a sectional view taken on line B1-B2 of FIG. 2A.

FIGS. 2A and 2B illustrate recesses each in the form of a trench. A conductive film formed in each of the trenches is, for example, a guard-ring for protecting a region other than a device region in wet etching of the device region. FIGS. 2A and 2B are a plan view and a sectional view, respectively.

FIGS. 3A to 3J illustrate a fabrication process according to the present invention.

First Embodiment

Figure 4:
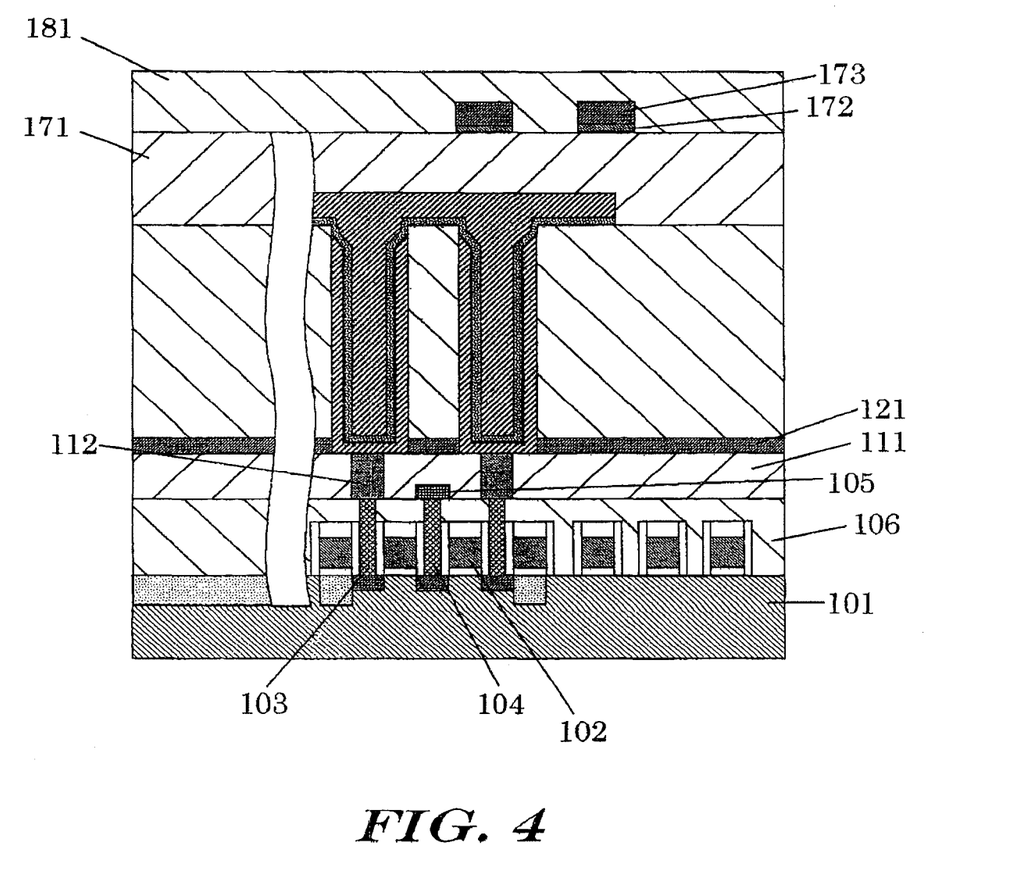
FIG. 4 is a sectional view illustrating a semiconductor device obtained by a fabrication method according to one embodiment of the present invention.

As illustrated in FIG. 4, cell transistor 102, memory cell contact plug 103, bit contact 104, first interlayer insulating film 106 and bit line 105, are formed on p-type semiconductor substrate 101.

Figure 3A:
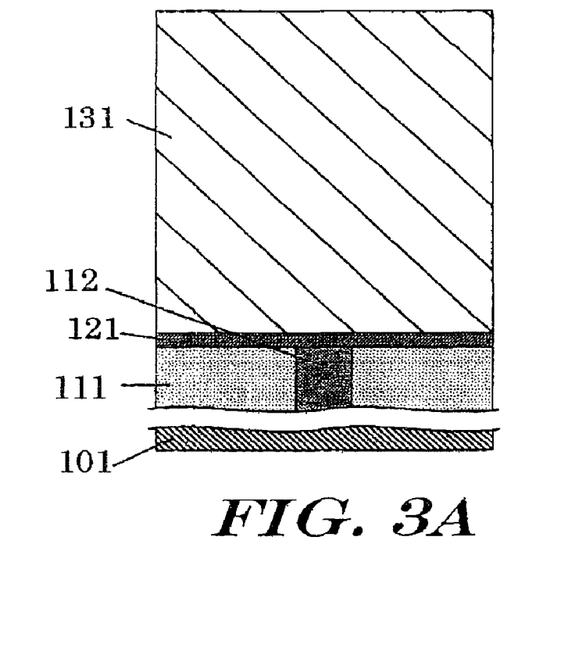
FIGS. 3A to 3J are sectional views illustrating process steps of a fabrication method according to one embodiment of the present invention.

(FIG. 3A: Step (a))

A silicon oxide film is deposited over the bit line (not shown) by CVD for example, followed by planarization by CMP, to form second interlayer insulating film 111.

A capacitor contact hole reaching the memory cell contact plug is opened to extend through second interlayer insulating film 111 at a portion thereof which lies between adjacent bit lines. Thereafter, a phosphorus-doped polycrystalline silicon film is deposited by LP-CVD, followed by planarization by CMP, to form capacitor contact plug 112 comprising the polycrystalline silicon film having a low resistivity, Stopper insulating film 121 is deposited for supporting the lower electrode of a capacitor. Stopper insulating film 121 is, for example, a silicon nitride film deposited by LP-CVD and has a thickness of 200 nm.

Figure 3B:
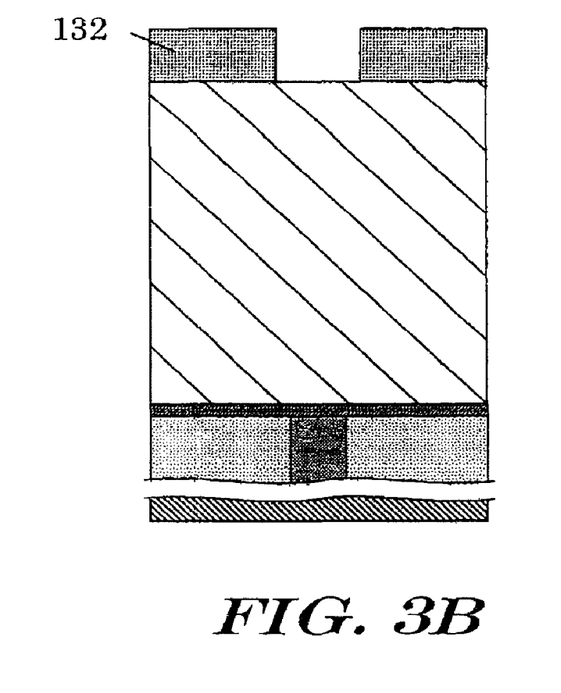

(FIG. 3B: Step (b))

Third interlayer insulating film 131 having a higher rate of wet etching using, for example, hydrofluoric acid than stopper insulating film 121 is formed over stopper insulating film 121. Third interlayer insulating film 131 comprising a silicon oxide film having a thickness of about 1,000 nm is deposited by LP-CVD for example. Third interlayer insulating film 131 may comprise an impurity-doped silicon oxide film, such as a BPSG film, a non-doped silicon oxide film, or the like.

The surface of third interlayer insulating film 131 is polished and planarized by CMP. By so doing, third interlayer insulating film 131 having a thickness of about 800 nm remains.

A predetermined pattern is formed in resist 132 for a capacitor hole patterning by using a lithography technique. A reflection preventive film may be used under resist 132. The opening width (diameter) W of the capacitor hole ranges from 100 to 200 nm in 1 Gb DRAM for example. In this embodiment, the opening width W is 150 nm. The plane pattern of the pattern thus formed is a hole pattern as illustrated in FIG. 1A.

Figure 3C:
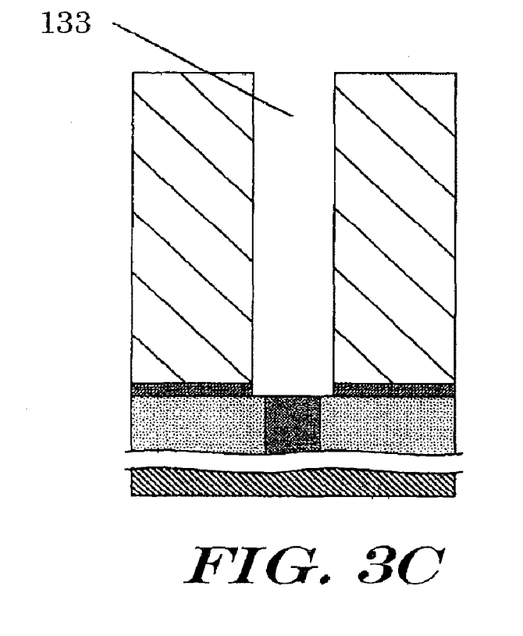

(FIG. 3C: Step (c))

Capacitor hole 133 having a depth of about 1,000 nm extending through third interlayer insulating film 131 and stopper insulating film 121 to reach capacitor contact plug 112, is formed using a lithography technique and an etching technique (step (c)). Thereafter, resist 132 is removed using a resist removing solution.

Figure 3D:
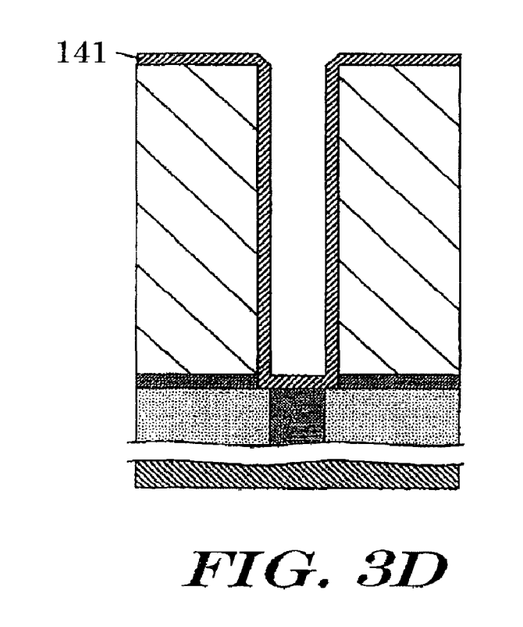

(FIG. 3D: Step (d))

Conductive film 141 is deposited. Conductive film 141 is, for example, a TiN film grown by CVD and has a thickness of 25 nm (step (d)). This conductive film may be a film stack comprising 10 nm-thick Ti and 15 nm-thick TIN for better connection to the underlying capacitor contact. In the present embodiment, the opening width W of the hole assumes 100 nm after the deposition of the conductive film. Since the depth of the hole is about 1,000 nm, the recess thus formed has an aspect ratio of 10.

Figure 3E:
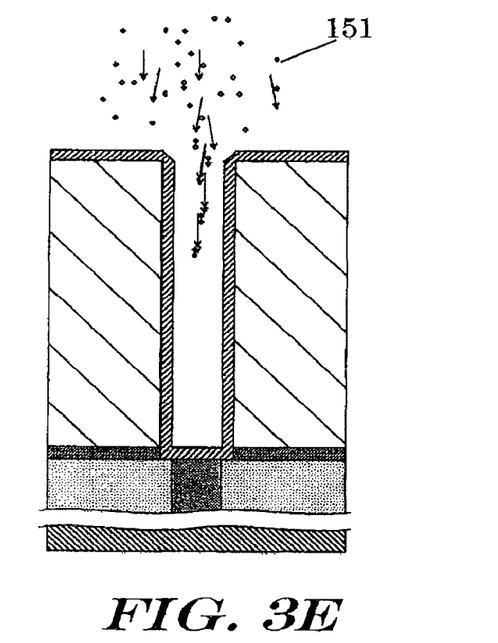
Figure 3F:
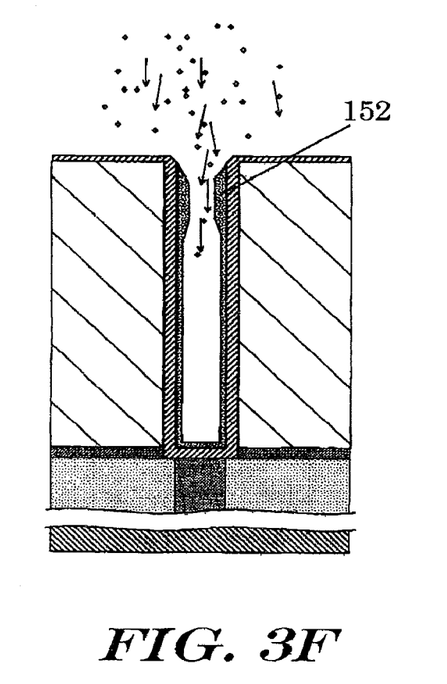

(FIGS. 3E and 3F: Steps (e) and (f))

Etching of the conductive film is performed using an ICP (Inductively Coupled Plasma) dry etching apparatus. When the conductive film is a TIN film or a TIN/Ti film stack, $BCl_3$ may be used as an etching gas. Besides Ti and a compound thereof, use may be made of Zr, Hf and compounds thereof as materials for the conductive film. In this case also, $BCl_3$ may be used as the etching gas.

Etching is performed under the following exemplary etching conditions:

$BCl_3$: 120 sccm, Ar: 60 sccm,

Pressure: 0.67 Pa (5 mTorr),

Source power: 800 W, and bias power: 50 W.

During the etching under these conditions, deposition film 152 is formed in the hole. In cases where the conductive film comprises TIN and the etching gas comprises $BCl_3$, the resulting deposition film has been confirmed to comprise boron and titanium by EPMA. However, the etching gas to be used is not limited to such gases. Use may be made of a halogen-type gas which allows formation of a nonvolatile deposition film to proceed preferentially over etching of the deposition film. While the $BCl_3$ gas is used by diluting with Ar in the above case, the $BCl_3$ gas may be diluted with any other inert gas or may not be diluted. During the dry etching, deposition and etching proceed competitively. At the top surface of the interlayer insulating film, etching proceeds preferentially over deposition of the deposition film and, therefore, etching of the conductive film progresses. In the hole, by contrast, deposition of deposition film 152 is considered to progress preferentially because of reduced entry of etching ions 151 into the hole.

Figure 3G:
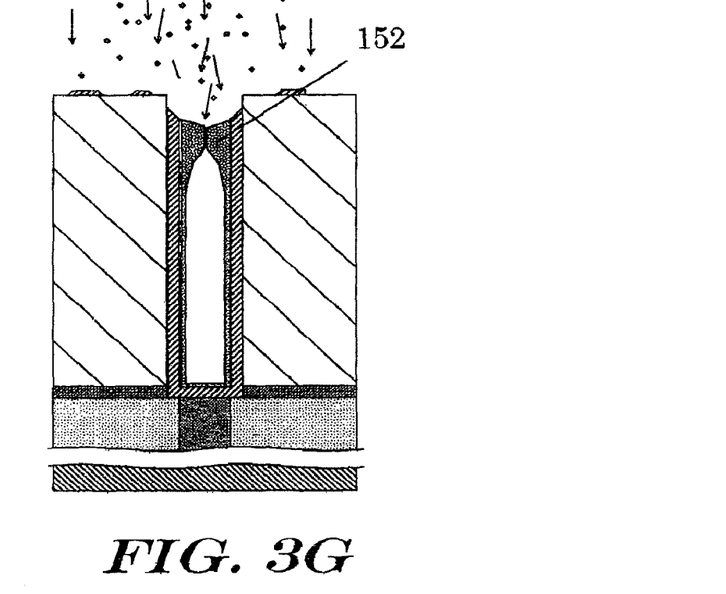

(FIG. 3G: Step (g))

When the opening diameter of the hole is relatively small, growth of the deposition film is remarkable, particularly at a location adjacent to the upper peripheral edge of the hole. For this reason, the deposition film sometimes closes the opening of the hole. The related art has an inconvenience that a portion of the conductive film which lies adjacent to the opening is undesirably etched and, hence, the conductive film is removed from a place in which the conductive film should remain. According to the present invention, by contrast, the deposition film works very effectively to allow the portion of the conductive film which lies adjacent to the opening of the hole to remain.

Figure 3H:
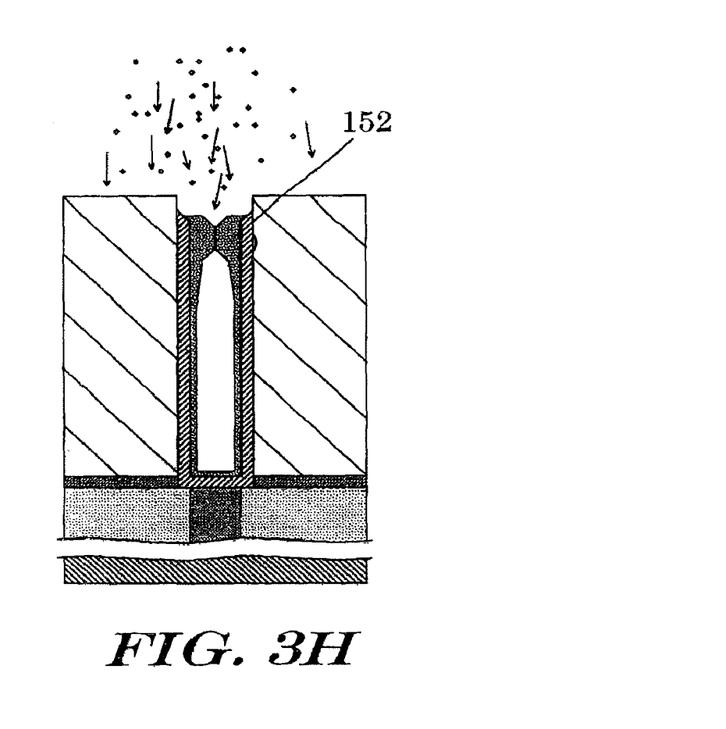

(FIG. 3H: Step (h))

In order to electrically isolate the lower electrodes of adjacent capacitors from each other, it is preferable to perform additional etching to completely remove conductive film 141 remaining on third interlayer insulating film 131. In the case of the related art using the above-described chlorine gas ($Cl_2$), however, when etching of conductive film 141 on third interlayer insulating film has progressed to such an extent as to substantially remove conductive film 141 and leave some residual portion, the consumption of the etching gas at the top surface of third interlayer insulating film is reduced extremely to cause the etching rate to increase at the sidewall portion of the recess. Thus, the problem of etching damage to the conductive film at the sidewall portion of the recess which lies adjacent to the opening becomes more conspicuous. For this reason, use of additional etching has heretofore had to be limited. The present invention, by contrast, can eliminate the inconvenience that the portion of the conductive film which lies adjacent to the opening of the hole is undesirably etched by the above-described additional etching and allows such additional etching to be performed safely because that portion of the conductive film is protected with the deposition film. During the additional etching, formation of a deposition film derived from the conductive film is reduced, whereas etching of the deposition film progresses. In cases where the interlayer insulating film formed with the hole is a silicon oxide film for example, the bias-applied etching as noted above causes the interlayer insulating film to be etched more rapidly than the deposition film when the interlayer insulating film begins being exposed partially. In some cases, the bias-applied etching allows a deposition film derived from the insulating film to be formed over the deposition film derived from the conductive film. In this way, etching of the deposition film derived from the conductive film is restricted. As a result, the additional etching of the interlayer insulating film becomes possible while allowing the precedingly formed deposition film derived from the conductive film to remain on the sidewall of the conductive film. The present invention has a further advantage of a widened process margin. This effect becomes conspicuous when the interlayer insulating film underlying the conductive film is a silicon oxide film or a silicon nitride film. This is the effect obtained when the interlayer insulating film is etched by $BCl_3$. A main mechanism of such etching is considered to be based on an ion-assisted etching mechanism.

The effect of the present invention was confirmed when the opening width of the hole was not more than 300 nm. When the opening width is more than 300 nm, it is estimated that deposition of the deposition film is difficult because of increased entry of etching ions into the hole. The present invention was confirmed to be effective when the hole had an aspect ratio of not less than 5. When the aspect ratio of the hole is less than 5, it is estimated that the amount of etching ions reaching the bottom of the hole increases and, hence, the bottom is etched before the deposition film covers the bottom of the hole.

Figure 3I:
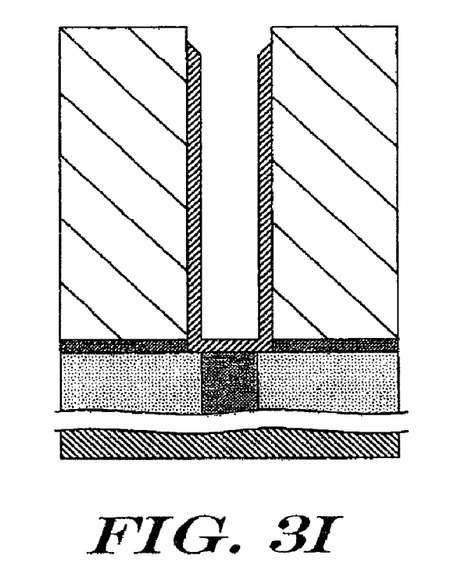

(FIG. 3I: Step (i))

After the removal of conductive film 141 remaining on third interlayer insulating film 131, deposition film 152 is removed with a wet-type cleaning liquid or by dry ashing.

Figure 3J:
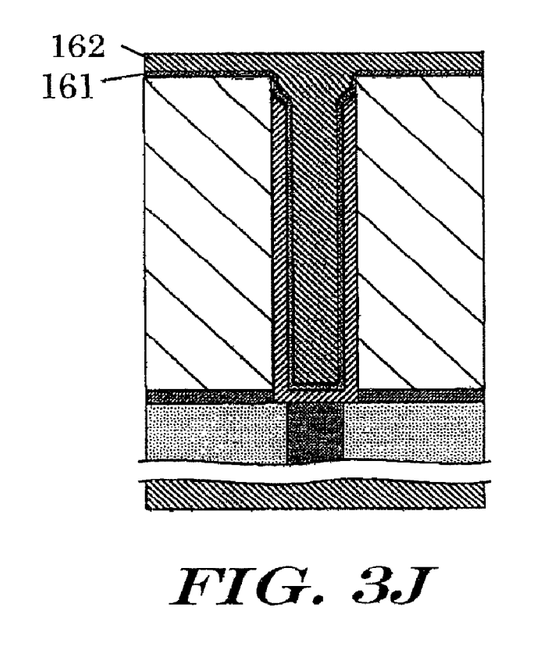

(FIG. 3J: Step (j))

Capacitor insulating film 161, e.g., $Ta_2O_5$ film, is deposited, for example, to a thickness of 100 nm.

Plate electrode 162, e.g., TiN film, is deposited, for example, to a thickness of 150 nm. Thus, a DRAM capacitor having a cylindrical shape is completed. While the foregoing description has been directed to the case where the internal wall of the conductive layer formed on the internal wall of the recess formed in the interlayer insulating film is utilized as a part of the capacitor, a crown-shaped capacitor can be formed by a process including: removing an interlayer insulating film having a recess by, for example, wet etching after having formed a lower capacitor electrode; and then forming a capacitor insulating film and an upper electrode.

(FIG. 4)

An interconnection step is performed to complete DRAM as a semiconductor device. The structure shown in FIG. 4 includes fourth interlayer insulating film 171, TiN 172, AlCu interconnection wire 173, and fifth interlayer insulating film 181.

Second Embodiment

While the recess in the form of a hole illustrated in FIG. 1 has been described in the first embodiment, the present invention was confirmed to be effective when the recess was in the form of a trench illustrated in FIG. 2. While a capacitor formed in a memory cell section of DRAM uses a recess in the form of a hole as illustrated in FIG. 1, a guard ring section of DRAM uses a recess in the form of a line trench as illustrated in FIG. 2.

It is apparent that the present invention is not limited to the above embodiments, but may be modified and changed without departing from the scope and spirit of the invention.

What is claimed is:

1. A method of fabricating a semiconductor device, comprising:
    forming an interlayer insulating film;
    forming a recess in the interlayer insulating film;
    forming a conductive film extending from a bottom and a sidewall of the recess onto a top surface of the interlayer insulating film such that a shape of an inner surface of the conductive film conforms with that of the recess; and
    selectively removing a portion of the conductive film formed on the top surface of the interlayer insulating film by dry etching such that a portion of the conductive film remains on the bottom and sidewall of the recess,
    wherein the dry etching is performed with forming a deposition film directly onto the inner surface of the conductive film including the bottom of the recess and with leaving a space surrounded by the deposition film in the recess such that a diameter of the space in an upper portion of the recess is smaller than a diameter of the space in a lower portion of the recess.

2. The method of fabricating a semiconductor device according to claim 1, wherein the recess has an opening width of not more than 300 nm after the formation of the conductive film.

3. The method of fabricating a semiconductor device according to claim 2, wherein the recess has a depth/opening width aspect ratio of not less than 5 after the formation of the conductive film.

4. The method of fabricating a semiconductor device according to claim 1, wherein the dry etching is carried out by using an etching gas comprising at least a boron compound, while the deposition film comprises at least a compound of a component of the conductive film with boron.

5. The method of fabricating a semiconductor device according to claim 4, wherein the dry etching is carried out by using an etching gas including BCl3.

6. The method of fabricating a semiconductor device according to claim 5, wherein the conductive film comprises TiN.

7. The method of fabricating a semiconductor device according to claim 6, wherein the deposition film comprises boron and titanium.

8. The method of fabricating a semiconductor device according to claim 1, wherein the dry etching includes:
    removing the portion of the conductive film formed on the top surface of the interlayer insulating film; and
    after the removing the portion of the conductive film, etching the top surface of the interlayer insulating film.

9. The method of fabricating a semiconductor device according to claim 8,
    wherein the interlayer insulating film comprises at least a silicon oxide film or a silicon nitride film; and
    wherein the etching the top surface of the interlayer insulating film is bias-applied etching.

10. The method of fabricating a semiconductor device according to claim 1, further comprising removing the deposition film after the dry etching has been performed.

11. The method of fabricating a semiconductor device according to claim 1, wherein the recess has a form of a hole.

12. The method of fabricating a semiconductor device according to claim 11, wherein the portion of the conductive film which remains in the recess forms a lower electrode of a capacitor.

13. The method of fabricating a semiconductor device according to claim 1, wherein the recess has a form of a trench.

14. The method of fabricating a semiconductor device according to claim 13, wherein the portion of the conductive film which remains in the recess forms a guard-ring.

15. The method of fabricating a semiconductor device according to claim 1, further comprising:
    forming a capacitor contact plug electrically connected to the bottom of the conductive film;
    removing the deposition film to expose the conductive film to be used for a lower capacitor electrode;
    forming a capacitor insulating film on a surface of the lower capacitor electrode; and
    forming an upper capacitor electrode on a surface of the capacitor insulating film.

16. The method of fabricating a semiconductor device according to claim 15, further comprising after removing the deposition film, removing the interlayer insulating film.

17. The method of fabricating a semiconductor device according to claim 16, wherein removing the interlayer insulating film is performed by wet etching.

18. A method, comprising:
    forming an insulating layer;
    selectively removing the insulating layer to form a hole in the insulating layer;
    forming a conductive film extending from a bottom and a sidewall of the hole onto a top surface of the insulating layer; and
    performing a dry etching to remove a portion of the conductive film formed on the top surface of the insulating layer with forming a deposition film onto an inner surface of the hole, the conductive film formed on the bottom of the hole being exposed to the dry etching, a thickness of the deposition film on an upper portion of the hole being larger than a thickness of the deposition film on a lower portion of the hole.

19. The method according to claim 18, further comprising removing the deposition film after performing the dry etching.

* * * * *